(12) United States Patent
Humphry et al.

(10) Patent No.: US 9,087,674 B2
(45) Date of Patent: Jul. 21, 2015

(54) CHARACTERISTIC DETERMINATION (75) Inventors: Martin Humphry, Sheffield (GB); Andrew Maiden, Sheffield (GB)

(73) Assignee: PHASE FOCUS LIMITED, Sheffield, South Yorkshire (GB)

( * ) Notice: Subject to any disclaimer, the term of this patent is extended or adjusted under 35 U.S.C. 154(b) by 246 days.

(21) Appl. No.: 13/642,257

(22) PCT Filed: Apr. 19, 2011

(86) PCT No.: PCT/GB2011/050777
§ 371 (c)(1),
(2), (4) Date: Oct. 19, 2012

(87) PCT Pub. No.: WO2011/131981
PCT Pub. Date: Oct. 27, 2011

(65) Prior Publication Data
US 2013/0033703 A1     Feb. 7, 2013

(30) Foreign Application Priority Data
Apr. 20, 2010   (GB) .................................. 1006593.6

(51) Int. Cl.
| G01N 21/00 | (2006.01) |
| H01J 37/22 | (2006.01) |
| G01B 11/24 | (2006.01) |
| G01B 11/30 | (2006.01) |
| G01N 23/04 | (2006.01) |

(52) U.S. Cl.
CPC .............. *H01J 37/222* (2013.01); *G01B 11/24* (2013.01); *G01B 11/303* (2013.01); *G01N 23/043* (2013.01); *H01J 2237/226* (2013.01); *H01J 2237/2614* (2013.01)

(58) Field of Classification Search
USPC ........................................ 356/72–73, 445, 601
See application file for complete search history.

(56) References Cited

U.S. PATENT DOCUMENTS

| 6,809,845 | B1 | 10/2004 | Kim et al. | |
| 2003/0155537 | A1* | 8/2003 | Machavariani et al. . | 250/559.27 |
| 2007/0211256 | A1 | 9/2007 | Medower et al. | |
| 2007/0244326 | A1 | 10/2007 | Shea et al. | |
| 2008/0285053 | A1 | 11/2008 | Tang | |

FOREIGN PATENT DOCUMENTS

| GB | 2292457 A | 2/1996 |
| WO | 2007/025147 A2 | 3/2007 |

OTHER PUBLICATIONS

Anonymous: 'Ellipsometry—Wikipedia, the free encyclopedia', [Online] Apr. 23, 2010, XP055105541 Retrieved from the Internet: [retrieved on Mar. 5, 2014].
'Handbook of Ellipsometry', Jan. 1, 2004, William Andrew, Springer, Norwich, Heidelberg deel 'Theory of Ellipsometry', XP055105559.

(Continued)

*Primary Examiner* — Abdullahi Nur
(74) *Attorney, Agent, or Firm* — Lando & Anastasi, LLP (57) ABSTRACT

Embodiments of the present invention provide a method of determining at least one characteristic of a target surface, comprising providing a phase map for a first region of a target surface via radiation having a first wavelength, providing n further phase maps for the first region via radiation having a further n wavelengths each different from the first wavelength, and determining at least one characteristic at the target surface responsive to the first and further phase maps.

14 Claims, 5 Drawing Sheets

(56) References Cited

OTHER PUBLICATIONS

A. Menzel et al., "Advanced Methods in Scanning X-Ray Microscopy", Proceedings of SPIE, vol. 7378, Jan. 1, 2009, pp. 737800-737800-9.

Adachi et al., "Shape Measurement Method of Rough Surface Using a Radial Shearing Interferometry", Journal of the Japan Society of Precision Engineering (2000), vol. 66, pp. 1236-1240.

Adachi et al., "Shape Measurement of Rough Step Like Surface Using a Laser Diode—the Method with Three-Wavelength Phase Shifting", Journal of the Japan Society of Precision Engineering (2002), vol. 65, pp. 418-422.

Ade H. et al., "Chemical Contract in X-Ray Microscopy and Spatially Resolved XANES Spectroscopy of Organic Specimens", Science USA, vol. 258, No. 5084, Nov. 6, 1992.

Bao Peng et al., "Phase Retrieval Using Multiple Illumination Wavelengths", Optics Letters, OSA, Optical Society of America, Washington, DC, US, vol. 33, No. 4, Feb. 15, 2008, pp. 309-311.

Cheng, "Multiple-Wavelength Phase Shifting Interferometry", Applied Optics (1985), vol. 24, pp. 804-807.

Chim et al., "Correlation Microscope", Optics Letters, vol. 15, No. 10, May 15, 1990.

Conroy et al., "A Comparison of Surface Metrology Techniques", <http://iopscience.iop.org/>.

De Groot, "Optical Thickness Measurement of Substrates Using a Transmitted Wavefront Test at Two Wavelengths to Average Out Multiple Reflection Errors", SPIE Proceedings (2002), vol. 4777, pp. 177-183.

Dubois, "Effects of Phase Change on Reflection in Phase-Measuring Interference Microscopy", Optical Society of America (2004).

Harasaki et al., "Offset of Coherent Envelope Position Due to Phase Change on Reflection", Applied Optics, vol. 40, No. 13, May 1, 2001.

Hariharan & Roy, "Achromatic Phase-Shifting for Two-Wavelength Phase-Stepping Interferometry", Optics Communications (1996), vol. 126, pp. 220-222.

International Search Report issued in International Application No. PCT/GB2011/050777, mailed Aug. 10, 2011, 5 pages.

Marathe et al., "Coherent Diffraction Surface Imaging in Reflection Geometry", Optics Express, Mar. 29, 2010, vol. 18, No. 7, pp. 7253.

Marcus et al., "X-Ray Photon-In/Photon-Out Methods for Chemical Imaging", TRAC, Trends in Analytical Chemistry, Elsevier, Amsterdam, NL, vol. 29, No. 6, Mar. 15, 2010, pp. 508-517.

Notification Concerning the Transmittal of International Preliminary Report on Patentability issued in international Application No. PCT/GB2011/050777 mailed Nov. 1, 2012, 9 pages.

Olszak et al., "Interferometry: Technology and Applications".

Rodenburg et al., "Transmission Microscopy Without Lenses for Objected of Unlimited Size", Ultramicroscopy, Elsevier, Amsterdam, NL, vol. 107, No. 2-3, Dec. 22, 2006, pp. 227-231.

U.K. Search Report for United Kingdom Patent Application No. GB1006593.6, Apr. 14, 2011, 2 pages.

Vorburger et al., "Comparison of Optical and Stylus Measurement of Surface Texture", Int J Adv Manuf Technol (2007) vol. 33, pp. 110-118.

Whitehouse, "Review Article—Surface Metrology", Meas. Sci. Technol (197), vol. 8, pp. 955-972.

Wynat, "White Light Interferometry".

* cited by examiner

CHARACTERISTIC DETERMINATION

The present invention relates to a method of determining characteristics such as material properties and/or topographic properties or the like at a target object. In particular, but not exclusively, the present invention relates to a method of determining optical properties or dielectric properties of a target object, such as complex refractive index, and/or topographic properties of the surface of the target object.

BACKGROUND

Reflected light undergoes a phase-shift that varies with the material composition of the reflecting surface. For brevity this phase change will be labelled the Phase Shift on Reflection (PSoR). At a dielectric-dielectric boundary a normally incident plane wave undergoes a PSoR depending on the relative refractive indices of the two materials. At an air-glass boundary for example PSoR=u. At dielectric-metal interfaces the PSoR varies with the metallic material. This shift is determined by the complex refractive index of the material (dependent upon material composition). Further variations occur with changes in wavelength of incident radiation and with the angle of the incidence of the illumination, and with changes in the relative height of the sample across a sampled area. PSoR variations due to these parameters can be a source of error for optically based, non-contact profilometers, since the optical path length of the test beam and measured fringe pattern are altered. The effect is directly analogous to an impedance mismatch causing back-reflections in an RF cable. Ellipsometry is generally used for measurement of PSoR, making use of the elliptical polarisation of light reflected from an obliquely illuminated sample. However ellipsometry measures average values over relatively large (>10 μm) illumination spot, and cannot easily produce spatial maps.

Common optical metrology methods for non-contact surface topography measurement such as scanning white light interferometry (SWLI), phase shifting interferometry (PSI) and digital holography are unable to distinguish between true height variations of a surface and phase changes caused by material variations. Typically prior knowledge of the composition of the surface is required to apply correction factors to the acquired data. In addition, they can suffer from topographic errors due to so-called 2π uncertainties where fringe order from the interferogram is mis-calculated.

It is an aim of embodiments of the present invention to at least partly mitigate the above-mentioned problems.

It is an aim of certain embodiments of the present invention to enable the determination of characteristics such as optical or dielectric properties of a target sample.

It is an aim of certain embodiments of the present invention to enable the determination of topographic properties of a target sample.

It is an aim of certain embodiments of the present invention to enable the determination of optical or dielectric properties and topographic properties of a target sample.

BRIEF SUMMARY OF THE DISCLOSURE

In accordance with a first aspect of the present invention there is provided a method of determining at least one characteristic of a target surface, comprising:
 providing a phase map for a first region of a target surface via radiation having a first wavelength;
 providing n further phase maps for the first region via radiation having a further n wavelengths each different from the first wavelength; and
 determining at least one characteristic at the target surface responsive to the first and further phase maps.

Aptly, the first region may be an area of the target surface having a single characteristic to be determined.

Aptly, the first region may be an area of the target surface having two or more characteristics to be determined, which vary over the first region.

Aptly, the method further comprises providing a phase map for a further region of a target surface via radiation having the first wavelength, providing n further phase maps for the further region via radiation having the further n wavelengths, and determining at least one characteristic at the first and further regions of the target surface responsive to each of the phase maps.

Aptly, the step of providing n further phase maps comprises providing n further phase maps for the first region via radiation having a further respective n wavelengths each different from the first wavelength.

Aptly, the method comprises providing the phase maps for a target surface via respective wavelengths of illumination where n=1, 2, 3, 4 or more.

Aptly, the method further comprises scaling each phase map prior to determining the at least one characteristic.

Aptly, the method comprises determining a change in phase for all points in n phase maps.

Aptly, the method comprises calculating $$\Delta\Phi_m = \Phi_{n+1} - \Phi_n$$

Aptly the method further comprises for each m, determining $$d = \frac{\Delta\Phi_m - \Delta\Phi_{m+1}}{\Delta\lambda \cdot 4\pi \left( \frac{1}{\lambda_m \lambda_{m+1}} - \frac{1}{\lambda_{m+1} \lambda_{m+2}} \right)}$$

Aptly the method comprises determining a relative PSoR by determining $$\text{Relative } PSoR(\lambda_n) = \Phi_n - \frac{4\pi d}{\lambda_n}$$

Aptly, the method comprises determining a change in phase via an iterative process.

Aptly, the method comprises determining a true quantative phase shift.

Aptly, the method comprises determining a change in height and/or optical or dielectric properties at the target surface as the at least one characteristic.

Aptly, the method comprises providing a reference portion with the target sample.

Aptly, the reference portion comprises a dielectric material having a constant PSoR.

Aptly, the PSoR changes linearly with wavelength.

According to a second aspect of the present invention there is provided an apparatus for determining at least one characteristic of a target surface, comprising:
 a receiver for receiving a phase map for a first region of a target surface generated using radiation having a first wavelength, and for receiving n further phase maps for the first region each generated using radiation having a respective one of n further wavelengths, each different to the first wavelength; and a processor for determining at least one characteristic at the target surface responsive to the first and further phase maps.

According to a third aspect of the present invention there is provided a computer program comprising instructions arranged, when executed, to implement a method of determining at least one characteristic of a target surface, comprising:

providing a phase map for a first region of a target surface via radiation having a first wavelength;

providing n further phase maps for the first region via radiation having a further n wavelengths each different from the first wavelength; and determining at least one characteristic at the target surface responsive to the first and further phase maps.

According to a fourth aspect of the present invention there is provided apparatus for determining at least one characteristic of a target surface, comprising:

a radiation source;

a sample locator for locating a surface of a target object at a desired location; and a detector arranged to detect radiation reflected from said surface.

Certain embodiments of the present invention provide the advantage that at least one characteristic of a target surface can be determined Certain embodiments of the present invention provide the advantage that distinct or combined surface maps of topography and material may be obtained using direct measurements.

Certain embodiments of the present invention provide the advantage that characteristics of a target surface can be obtained by a technique less complex than previously known techniques.

Further advantages of the present invention will be apparent from the following description.

BRIEF DESCRIPTION OF THE DRAWINGS

Embodiments of the invention are further described hereinafter by way of example only with reference to the accompanying drawings, in which.

DETAILED DESCRIPTION

Figure 6:
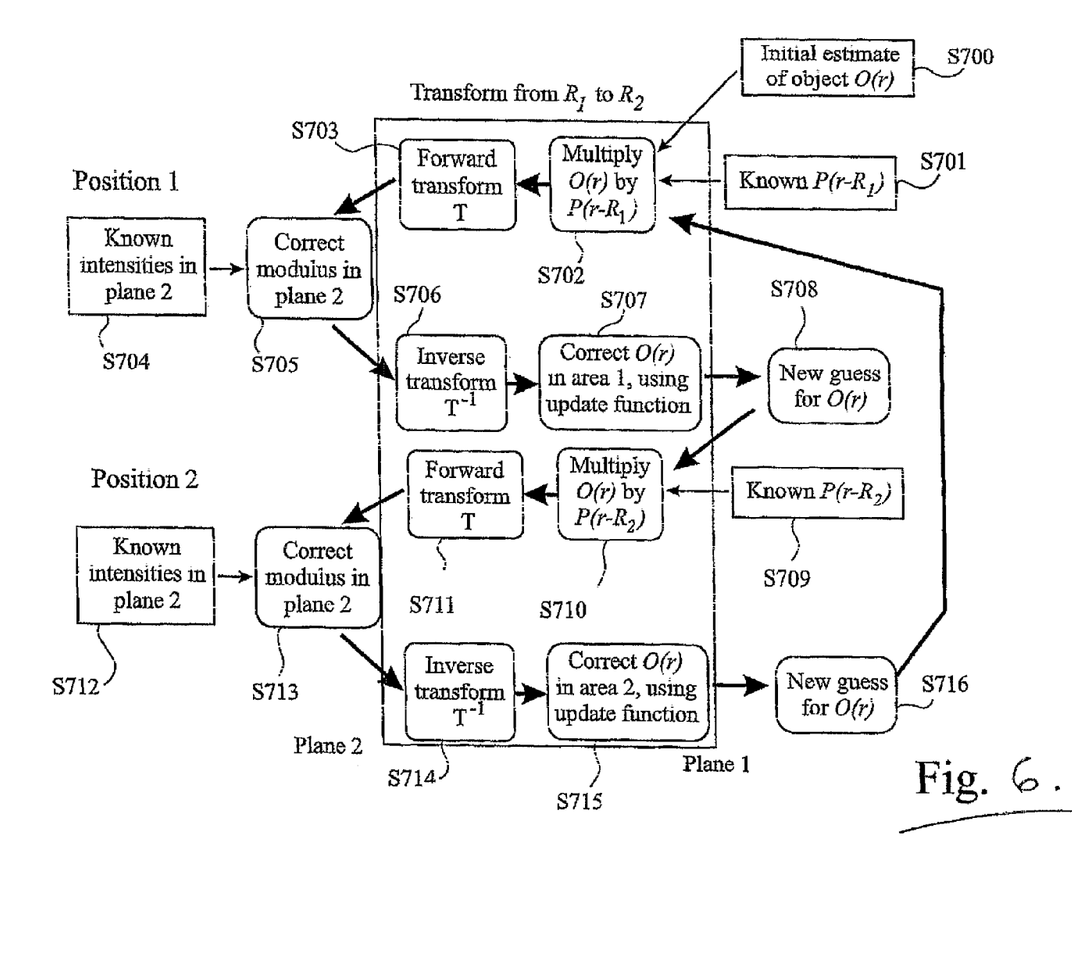
FIG. 6 illustrates an example of a phase retrieval algorithm.

The present invention employs spatial phase maps for determining characteristics such as optical or dielectric properties and/or topography of a surface of a target object. Various methods of calculating a spatial phase map are known in the art. Various iterative processes have been proposed for creating spatial phase maps of an area of a target object, which can be used to provide image data for generating an image of the target object. WO2005/106531, for example, describes such a method, and is incorporated herein in its entirety by reference. WO2005/106531 describes, amongst other things, an algorithm for obtaining a wave function of a target, as described below with respect to FIG. 6. FIG. 6 illustrates an algorithm for obtaining a wave function of an object and thus for obtaining image data which may be used subsequently to generate high resolution images of an object. FIG. 6 illustrates one possible method which includes moving the aperture from a first position after measuring the diffraction pattern to a second position where a second respective diffraction pattern may be measured. It will be understood that embodiments may use one or more positions for the aperture. Also embodiments can be used whereby rather than moving the aperture the location where the weakly focused radiation falls on the specimen may be selected.

O(r) and P(r) represent two-dimensional complex functions, that is, each point in O(r) or P(r), where r is a two-dimensional coordinate, has associated with it a complex number. In what follows, O(r) will physically represent an exit wave that would emanate from an object function which is illuminated by a plane wave. For example, in the case of electron scattering, O(r) would represent the phase and amplitude alteration into an incident wave as a result of passing through the object of interest.

In what follows P(r) represents either an illumination function, such as that generated by a caustic or illumination profile formed by a lens or other optical component (e.g., it being understood that P(r) is the complex stationary value of this wavefield calculated at the plane of the object function) or a filtering function, such as an aperture or transmission grating mounted downstream of the object function.

It may be assumed in what follows that O(r) or P(r) can be moved relative to one another by various distances R. The nomenclature adopted is written in terms of moving P(r), although equivalently we could instead move O(r) relative to P(r). In both situations, the complex value of O(r) is altered by forming the product of O(r) with P(r−R) to give a total exit wave function of ψ(r), i.e.

$$\psi(r,R)=O(r)P(r-R) \qquad 1$$

This will generally be satisfied. It is notable that there are very few practical restrictions on either the object function or the probe/aperture function. Neither function may be a plane wave, or periodic with a repeat distance that is a multiple of the difference between different values for R. This is because the algorithm requires several measurements that are different in order to work. In experimental practice these criteria are easy to satisfy.

The algorithm works to find the phase and intensity of the complex function ψ(r,R). It requires as input knowledge of the function P(r−R), and one or more (preferably several) measurements of the intensity of the wave function in a plane which is different to that containing the specimen. It is convenient to use the diffraction plane, which is related to the specimen plane by the Fourier transform. In this case the measured input data is the intensities of the diffraction patterns at one or more probe/aperture positions. Using diffraction data has several advantages, including ease of collection, no requirements for focusing the exit wave function into an image, and the increase of resolution achieved by measuring data at high angles.

However it is also possible to run the algorithm based on a set of defocused images measured at some distance from the exit surface of the specimen/aperture. In this situation the free space propagator is substituted for the Fourier transform.

The algorithm is not restricted to use of these two transforms. Other effective transforms could be used to move from one plane of information to the other. In what follows a general transform T is referred to that transforms a wave function from the first plane, called plane 1, to the second plane, called plane 2.

The algorithm works as follows and with reference to FIG. 6:

1. Start at step S700 with a guess at the object function $O_{g,n}(r)$, where the subscript g, n represents a guessed wave at the nth iteration of the algorithm. These functions are in plane 1 (which is the real space plane if the Fourier transform is used). Preferably the first guess of $O_{g,n}(r)$ equals unity at all points r. This corresponds to an absent specimen.

2. A known aperture in terms of position and characteristics is selected at step S701. This provides a probe function $P(r-R)$. At step S702 the current guess at the object function is multiplied by the aperture or probe at the current position R, $P(r-R)$. This produces the guessed exit wave function (still in plane 1) for position R, $$\psi_{g,n}(r,R) = O_{g,n}(r)P(r-R) \qquad 2$$

3. Next at step S703 a transformation of $\psi_{g,n}(r,R)$ to obtain the corresponding wave function in plane 2 (which would be the diffraction space plane if the Fourier transform is used), for that position R. Here T is used to represent some general transform that would often be the Fourier transform, but could also be the Fresnel free space propagator, or some other transform suited to a particular application of the algorithm.

$$\psi_{g,n}(k,R) = T[\psi_{g,n}(r,R)] \qquad 3$$

k is the coordinate in plane 2. (For the Fourier transform, k would be the usual reciprocal space coordinate. For the propagator, k would be the xy coordinate in the defocused plane.) It is important to note that $W_{g,n}(k,R)$ is a "guessed" version of the actual wave function in plane 2, since it has been produced by the guessed object function $O_{g,n}(r)$. Successive iterations of the algorithm will produce increasingly accurate versions of $W_{g,n}(k,R)$.

Note that $\psi_{g,n}(k,R)$ can be written in the form:

$$\psi_{g,n}(k,R) = |\psi_{g,n}(k,R)|e^{i\theta_{g,n}(k,R)} \qquad 4$$

where $|\psi_{g,n}(k,R)|$ is the (guessed) wave function amplitude and $\theta_{g,n}(k,R)$ is the (guessed) phase in plane 2 at iteration n, for position R.

By measuring the intensity of the diffraction pattern by known techniques such as detector array 32 information about the actual transformed exit wave function are known. A measured intensity of the diffraction pattern where the aperture is in a first position thus forms the basis of an estimate of the complex wave function of the diffraction pattern. However the measured intensity does not provide information about the phase of the wave function. Rather the measured intensity is comparable to the squared modulus of $\psi(r)$. That is $|\psi(r)|^2$. Once the intensity of radiation in the diffraction pattern in plane 2 is known at step S704 then the following step may be carried out.

4. Correct, at step S705 the intensities of the guessed plane 2 wave function to the known values.

$$\psi_{c,n}(k,R) = |\psi(k,R)|e^{i\theta_{g,n}(k,R)} \qquad 5$$

where $|\psi(k,R)|\bigstar$ is the known plane 2 modulus. That is the square root of the measured intensity at the image plane.

5. Inverse transform S706 back to real space to obtain a new and improved guess at the exit wave function (in plane 1) ($T^{-1}$ represents the inverse of the previously used transform T), $$\psi_{c,n}(k,R) = T^{-1}[\Psi_{c,n}(k,R)] \qquad 6$$

6. Update via step S707 the guessed object wave function in the area covered by the aperture or probe, using the update function $$O_{g,n+1}(r) = \qquad 7$$
$$O_{g,n}(r) + \frac{|P(r-R)|^l P*(r-R)}{|P_{max}(r-R)|^l(|P(r-R)|^2 + \delta)} \beta(\psi_{c,n}(r,R) - \psi_{g,n}(r,R))$$

where the parameters β, δ and l are appropriately chosen, and $|P_{max}(r-R)|$ is the maximum value of the amplitude of P(r). The result is a new guess for the object function (S708).

The update function helps make the effective deconvolution that occurs possible and introduces a weighting factor which causes the object function to be updated most strongly where the probe function has largest amplitude. The selectable constant l may be set to 1. It may be selected as any value in the range of 0 to 3 and need not be an integer value. It is useful to set l>1 when there is much noise. l may be selected l<1 when because of scattering geometry, the detected intensity is of the form of a Gabor hologram or similar. The value δ is used to prevent a divide-by-zero occurring if |P(r-R)|=0. δ is a small real number as is commonly applied in Weiner Filters and is usually (though not necessarily) smaller than $P_{max}$ and can be considerably smaller if the noise present in the recorded data is small. The constant β controls the amount of feedback in the algorithm, and may advantageously be varied between roughly 0.1 and 1. When β=less than 0.5, the previous estimate of the object is considered to be more important than the new estimate. Values in between vary the relative importance of the two estimates. β determines how quickly a solution is reached.

δ is a parameter which may be set at a fixed value or which may vary. It indicates how noisy the recorded data is and is used to attenuate how the updating is carried out in response to these circumstances. If good conditions exist for data collection that is to say with high beam current (high flux), which would imply low shot-noise, then it is safer to use results gathered to update the guessed estimate. Consequently the value of δ can be a small fraction of $P_{max}$ (e.g. less than $\frac{1}{10}^{th}$).

The expression:

$$\frac{|P(r-R)|^l}{|P_{max}(r-R)|^l} \qquad 8$$

maximises the update effect of regions where |P(r-R)| is large. This is useful, since it is those regions which are receiving the highest amount of incident radiation, and therefore which contain information with a relatively high signal to noise ratio. This information is clearly more valuable than that from regions where very little radiation is incident, and which is heavily affected by noise.

For the situation where β=1, l=0 and δ=0, and the function P(r-R) is a mask that is can be represented by a region where its value is unity while it is zero elsewhere, or support function, the algorithm has some similarities to the well known Fienup algorithm. If in this situation, only one position R is used, then the algorithm reduces to being mathematically identical to the basic Fienup algorithm. Where more than one position R is used, the algorithm has considerable advantages over known methods, including the fact that it does not suffer from uniqueness issues, and that a wider field of view may be imaged.

Subsequent to updating the running estimate of the guess the algorithm shown in FIG. 6 progresses to selecting a new position R which at least in part overlaps the previous position. The overlap should preferably be more than 20% and is preferably 50% or more. This may be achieved by either moving the aperture by a predetermined amount or by causing the illuminating radiation to fall upon a different region of the target. It will be understood that embodiments may successfully provide image data for one location of a target object without any change in location of an aperture or incident radiation being made. In such embodiments after step S708 the algorithm returns to step S702. Instead of the initial estimate of the object function O(r) being loaded in the new guess for O(r) of step S708 is loaded in. On each iteration the new guess for the object function will approximate closer and closer to the actual object function as on each iteration information of the known intensity and thus the known amplitude component of the incident radiation is added to improve the accuracy of the estimate.

Nevertheless the more preferable method is to move to a new position R which in part overlaps the previous position as shown in FIG. 6.

A known probe function $P(r-R_2)$ at the second position is identified at step S709 and then the step as above mentioned are repeated so that the new guess generated in step S708 is multiplied with the new known probe function identified at step S709. This is illustrated in step S710. Effectively this generates an exit wave function either post specimen or post aperture depending upon the embodiment concerned. The resulting exit wave function is propagated at step S711 to provide an estimate of the scattering pattern which should be detected at that position. The diffraction pattern is measured at step S712 which provides intensity information and thus amplitude information about the transformed wave function. The intensity information is used to correct the amplitude of the transformed wave function whilst phase information is retained at step S713. This corrected wave function is inversely propagated via Fourier transformation (when the image is formed in the far field), Fresnel transformation when the image is formed at a location where Fresnel diffraction dominates or by any other suitable transformation. This is illustrated at step S714. The running estimate of O(r) is then corrected according to the update function shown above at step S715 and the result is a new guess for the object function illustrated in step S716.

At this stage further movement of the illumination or aperture may be made to a third or further position. Again a location where some overlap occurs between previous illuminated locations is preferable. In this way the whole target object may optionally be mapped. Alternatively the new guess generated at step S716 may be repeated without further positioning knowing known diffraction pattern results. In FIG. 6 the iterative method is illustrated as being repeated by returning to step S702 in which the new guess generated at step S716 is input to the multiplication stage rather than the initial estimate of the object function supplied at step S700.

The iterative method may be repeated until a predetermined event occurs. For example the iteration may be repeated a predetermined number of times, for example 1000 times or until the sum squared error (SSE) is sufficiently small. The SSE is measured in plane 2, as $$SSE = \frac{(|\Psi_{g,n}(k, R)|^2 - |\Psi(k, R)|^2)^2}{N} \qquad 9$$

where N is the number of pixels in the array representing the wave function.

During the iteration process the most up-to-date guess of the object function provides a running estimate for that object function. When the iteration process is completed as determined by the occurrence of a predetermined event, the running estimate of the object function provides image data at the locations which are either illuminated by the incident radiation or which are selected by location of a post target object aperture. This image data includes amplitude and phase information which can subsequently be used to generate a high resolution image of the selected region of the target object.

The moving probe algorithm has been used to recover the phase of the wave function created when a STEM probe is incident onto an object with the transmission function shown in the first row. This transmission was created by taking an image measured with a CDD camera of gold particles on an amorphous carbon background, treating that image as an amplitude object only, and propagating the result by 1000 Å, to obtain the intensity and phase shown.

The STEM probe has an aperture size 0.25 Å$^{-1}$, defocus 3000 A, and a total number of counts of $1.0 \times 10^6$. This probe is to be multiplied with the object transmission function, for several different probe positions in a 128×128 pixel array. The resulting wave functions are Fourier transformed to obtain diffraction patterns.

The algorithm was run, with parameters from equation 7 of $\beta=1$, $\underline{l}=1$ and $\delta=0.0001$, for 2000 iterations, at which point the SSE in diffraction space was $1.444 \times 10^{-7}$, and still decreasing quickly. The recovered wave function at this stage is shown in the fourth row of FIG. 8. Clearly the algorithm works very well. The same experiment was repeated twice more with the inclusion of added Poisson noise, with a mean value of first 1.0, and secondly 5.0. The value of $\beta$ was modified to $\beta=0.6$, which resulted in an improved convergence. The addition of noise has an effect on the algorithm. It is particularly clear that the object transmission function is only effectively recovered in the vicinity of the set of probe positions used for that retrieval. This is the expected behaviour as very little is known about the object in regions where the probe is vanishingly small. The results shown have been scaled to the same greyscale as the original object transmission function. It is clear that the structure and some of the detail of the object are recovered, even in the case where the noise is relatively high.

The above-described algorithm thus provides a method of phase retrieval which is applicable to many situations in microscopy with particular emphasis on its applicability to scanning transmission electron microscopes. The method required as input intensity information only measurements from a small number (one or more) of different probe or aperture positions and this therefore removes the need for post-specimen lenses thus avoiding the problems associated with aberrations of such lenses. The algorithm employed converges rapidly to retrieve the phase of the object transmission function. This enables high resolution images illustrating the structure of target objects to be generated in real time. The algorithm is also effective in noisy situations and works for a very wide variety of different objects and probe functions. The algorithm also enables probe functions to be calculated when target objects having a predetermined structure are used.

It will be appreciated by those skilled in the art that other iterative processes could be used to provide a phase map according to certain embodiments of the present invention.

It should be noted that the image data based upon such phase mapping will of course be related to material composition, refractive index and the relative height of different areas of the map, and so on. In the following example, a method of creating a spatial phase map as described in WO2005/106531 will be employed. Of course, it will be clear to a person skilled in the art that the present invention is not so limited and alternative methods could be used.

Figure 1:
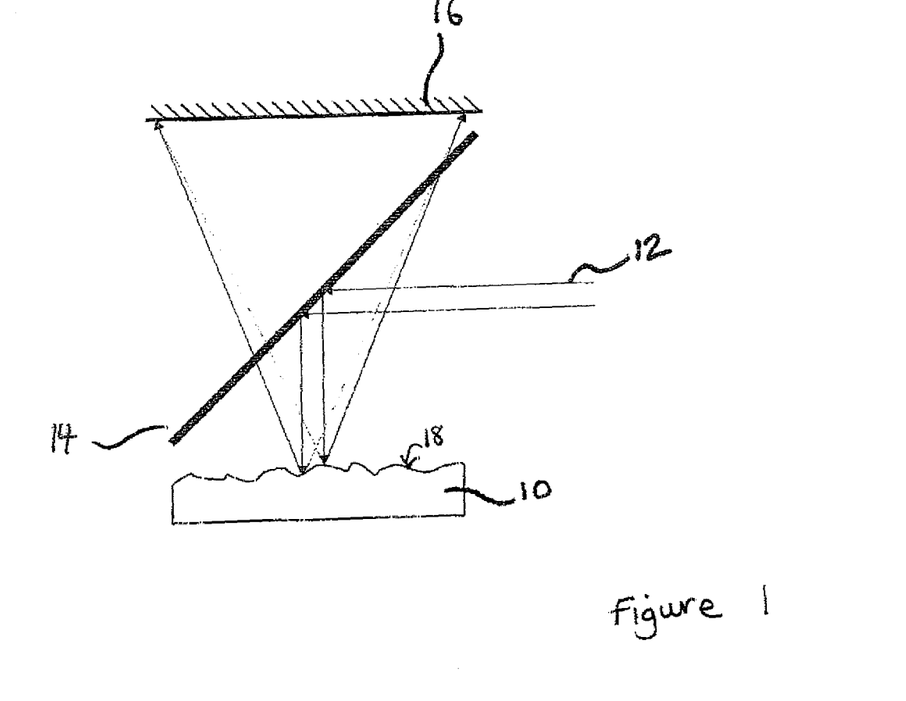
FIG. 1 illustrates a view of radiation being reflected from a target sample

FIG. 1 shows an arrangement from which a spatial phase map can be obtained from a target sample 10. A source (not shown) provides radiation such as collimated illumination 12 which falls upon a surface of the target sample 10. It will be appreciated that different types of radiation can be utilised according to certain embodiments of the present invention. In the example shown in FIG. 1, collimated illumination is directed towards the target sample 10 via a beam splitter 14. Of course radiation could alternatively be provided to the sample directly.

The illumination 12 at least partially reflects off the surface of the sample 10 and is detected by a detector 16. The scattering pattern of the illumination which reflects from a particular region or pixel of the sample may then be detected and manipulated as described in WO2005/106531. From the data from each region or pixel, a spatial phase change map showing relative variations in measured phase across the area of the map can be generated. The relative variations are a result of a combination of topography and material composition variations, and the like.

Figure 2:
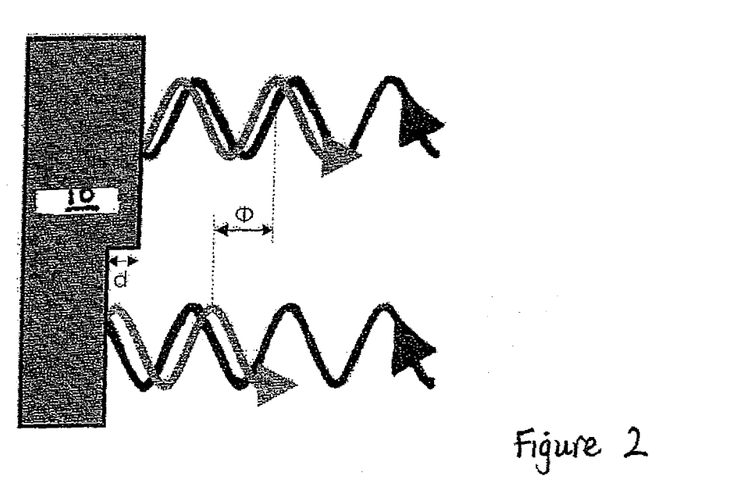
FIG. 2 illustrates a further view of radiation being reflected from a target sample

As can be seen in FIG. 1, the surface 18 of the target sample 10 is not smooth. FIG. 2 shows an example of a phase shift on reflection (PSoR) of radiation reflecting from a target sample 10. The PSoR, represented by (I), indicates the change of phase of the radiation caused by hitting the sample 10. As discussed above, the PSoR can be affected by material composition and changes in the relative height of the sample across a sampled area, for example. In FIG. 2, assuming that a uniform material is illuminated by light having wavelength $\lambda$, a change in height, d, will give rise to a phase change $\Phi$ according to:

$$\Phi = \frac{4\pi d}{\lambda}$$

If however, the height change is accompanied by a change in material, then a relative PSoR term, $\delta$, must be added and the measured change in phase will become:

$$\Phi = \frac{4\pi d}{\lambda} + \delta$$

For most materials, $\delta$ will be dependent on illumination wavelength, and is approximately linear for small wavelength variations. Collection of phase maps at two or more wavelengths enables both the surface height variations (d) and relative PSoR ($\delta$) to be calculated. The phase change at a given point over a range of wavelengths is given by:

$$\Phi_{\lambda 1} = \frac{4\pi d}{\lambda} + \delta_{\lambda 1} \quad (*)$$

$$\Phi_{\lambda 2} = \frac{4\pi d}{\lambda} + \delta_{\lambda 2}$$

$$\Phi_{\lambda 3} = \frac{4\pi d}{\lambda} + \delta_{\lambda 3}$$

$$\ldots$$

$$\Phi_{\lambda n} = \frac{4\pi d}{\lambda} + \delta_{\lambda n}$$

The wavelength dependence of $\delta$ can be approximated by:

$$\delta(\lambda) = a_0 + a_1 \lambda + a_2 \lambda^2 + a_3 \lambda^3 + \ldots a_n \lambda^n$$

Where $a_0$, to $a_n$ are constants. For most metals, over optical wavelengths, $\delta(\lambda)$ is approximately linear. So, terms $a_2$, $a_3$, ..., $a_n$ are $\ll 2\pi$ and can therefore be ignored. For other materials, such as semiconductors, $\delta(\lambda)$ is $\ll 2\pi$, so again higher order terms (above $a_1$) can be ignored.

If we take the difference between phase maps for a series of different wavelengths, we get:

$$\Delta\Phi_{12} = \Phi_{\lambda 1} - \Phi_{\lambda 2} = \left(a_1 - \frac{4\pi d}{\lambda_1 \lambda_2}\right)(\lambda_1 - \lambda_2)$$

$$\Delta\Phi_{23} = \Phi_{\lambda 2} - \Phi_{\lambda 3} = \left(a_1 - \frac{4\pi d}{\lambda_2 \lambda_3}\right)(\lambda_2 - \lambda_3)$$

and so on.

In order to simplify things, it is assumed in this embodiment that the wavelengths are evenly spaced, so $(\lambda_1-\lambda_2)=(\lambda_2-\lambda_3)=(\lambda_n-\lambda_{n-1})=\Delta\lambda$. Taking the difference between any two of the above equations gives:

$$\Delta\Phi_{12} - \Delta\Phi_{23} = \Delta\lambda 4\pi d \left(\frac{1}{\lambda_1 \lambda_2} - \frac{1}{\lambda_2 \lambda_3}\right)$$

Greater accuracy may possibly be achieved with 3 closely-spaced wavelengths. This expression gives a map of direct values for d, the height variation across the region of measurement. Since d is a constant independent of wavelength, variations in d with wavelength provide a measure of the uncertainty in the results.

The calculated map of d can then be used in the equations marked (*) to produce PSoR maps at each wavelength. That is:

$$\Phi_{\lambda n} = \frac{\Phi_{\lambda n} \cdot \lambda_n}{4\pi d}$$

The pixel spacing in phase maps generated by the above-described method is dependent on wavelength, so each map should be scaled laterally to ensure all maps can be accurately aligned and subtracted from each other. The shortest wavelength map should be rescaled to match the longest wavelength map as the shortest wavelength map will have a higher lateral resolution.

Figure 3:
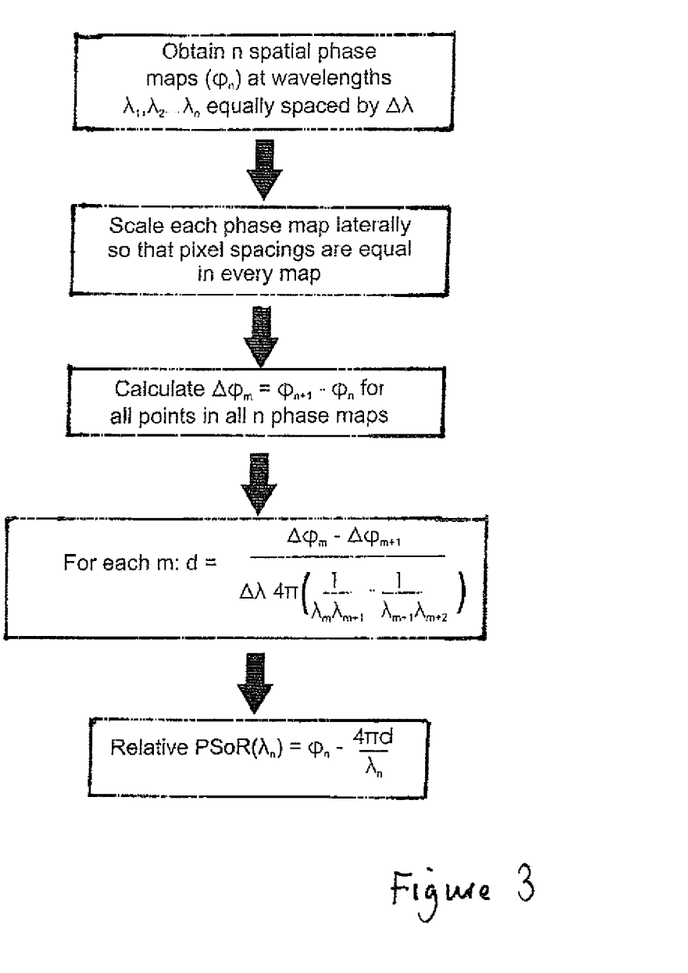
FIG. 3 illustrates a flow chart of a method according to an example of the invention

The process according to an embodiment of the invention is illustrated in the flow chart of FIG. 3. It should be noted that where measurements are taken at two different wavelengths, m=1, where measurements are taken at three different wavelengths, m is 1 or 2. And so on.

Figure 4:
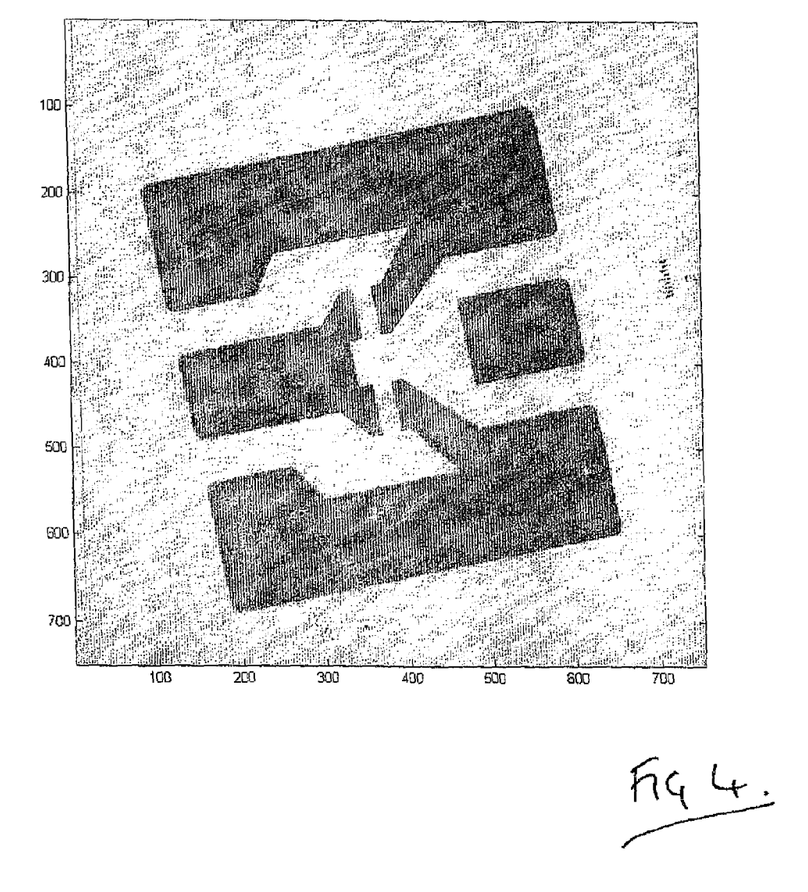
FIG. 4 illustrates the results of measuring height of a target object
Figure 5:
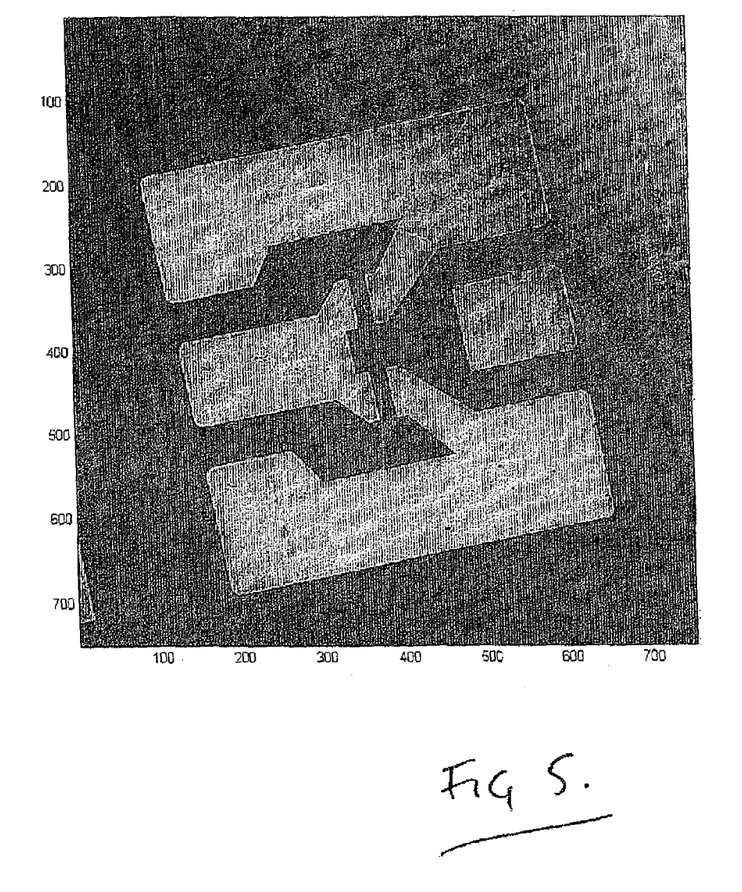
FIG. 5 illustrates the results of measuring relative PSoR (δ) of a target object

FIG. 4 shows images of variations in height of a target sample obtained using the above-described method. FIG. 5 shows images variations in of relative PSoR ($\delta$) of a target sample obtained using the above-described method.

The PSoR values calculated by the above method are relative values, and as such if true quantitive PSoR measurements are required a reference feature of known material (and PSoR) must be included in the region measured. A database of $\delta(\lambda)$ curves can be used to identify unknown materials.

The principles described above could also be applied to phase maps collected via other methods, such as digital holography or interferometry.

In the embodiment described above, a collimated illumination beam is used at normal incidence to the surface. It is also possible to have other arrangements where the illumination is formed by a focused beam or with illumination at a non-normal angle of incidence. However, the exact values of measurements from each arrangement may differ slightly due to the angular dependence of PSoR.

The use of 3 wavelengths in the calculation of d extends the range of uniquely identifiable height variations before phase "wrapping" causes multiple possible solutions that require a phase unwrapping algorithm. Assuming evenly spaced wavelengths as before (with spacing $\Delta\lambda$, the combined effective synthetic wavelength would be:

$$\lambda_{eff} = \frac{\lambda_1 \lambda_2 \lambda_3}{2\Delta\lambda}$$

Where $\lambda 1, \lambda 2,$ and $\lambda 3$ are sequential wavelengths separated by $\Delta\lambda$. If typical optical values are used, eg. around 600 nm and $\Delta\lambda$ is 10 nm the measurable range in height increases from around 300 nm to nearly 3 mm.

The complex refractive index of a material determines the PSoR according to the equation $$\delta(\lambda) = \arctan\left(\frac{2\kappa(\lambda)}{1 - \kappa^2(\lambda) - n^2(\lambda)}\right)$$

Where n is refractive index and K is the extinction coefficient.

With the method of the present invention, distinct or combined surface maps of characteristics such as topography and material may be obtained. Furthermore, the method of the present invention presents a less complex way of measuring these values compared to known techniques. In addition, direct measurements may be made of relative material-dependent phase changes. Problems of poor fringe visibility and difficulty in measuring phase accurately from the intensity of interference fringes are avoided.

PSoR can be separated from surface topography by using the spatial phase maps at two or more wavelengths.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method of determining at least one characteristic of a target surface, comprising:
   providing a phase map for a first region of a target surface via radiation at least partly reflected from the target surface having a first wavelength;
   providing two further phase maps for the first region via radiation at least partly reflected from the target surface having a further two wavelengths each different from the first wavelength;
   determining a map of height variations for the first region of the target surface based on the first and two further phase maps; and
   determining a relative phase shift on reflection at the target surface responsive to the first and two further phase maps and the map of height variations, wherein the relative phase shift on reflection (PSoR) is indicative of a change in phase resulting from a material composition of the target surface.

2. The method of claim 1, wherein the relative PSoR is determined by:

$$RelativePSoR(\lambda_n) = \Phi_n - \frac{4\pi d}{\lambda_n}$$

where $\lambda_n$ is one of the first and two further wavelengths and $\Phi$ is a phase change at one of the first and two further wavelengths.

3. The method of claim 1, comprising determining:

$$\Delta\Phi_{12} = \Phi_{\lambda 1} - \Phi_{\lambda 2} = \left(a_1 - \frac{4\pi d}{\lambda_1 \lambda_2}\right)(\lambda_1 - \lambda_2)$$

$$\Delta\Phi_{23} = \Phi_{\lambda 2} - \Phi_{\lambda 3} = \left(a_1 - \frac{4\pi d}{\lambda_2 \lambda_3}\right)(\lambda_2 - \lambda_3)$$

where $a_1$ is a constant, $\lambda_1, \lambda_2, \lambda_3$ are the first wavelength and two further wavelengths, respectively, and $\Phi_{\lambda 1}, \Phi_{\lambda 2}, \Phi_{\lambda 3}$ are the phase change at the first and two further wavelengths.

4. The method according to claim 1, comprising scaling each phase map prior to determining the PSoR.

5. The method according to claim 1, further comprising: for each m, determining $$d = \frac{\Delta\Phi_m - \Delta\Phi_{m+1}}{\Delta\lambda \cdot 4\pi \left(\frac{1}{\lambda_m \lambda_{m+1}} - \frac{1}{\lambda_{m+1} \lambda_{m+2}}\right)}$$

where $\Delta\Phi_m = \Phi_{n+1} - \Phi_n$ and $\Phi$ is a phase change and n is one of the first and two further wavelengths.

6. The method according to claim 1, further comprising: determining a change in phase via an iterative process.

7. The method according to claim 1, further comprising: determining a change in optical or dielectric properties at the target surface.

8. The method according to claim 1, further comprising:
providing a reference portion of known material having a known PSoR with the target sample.

9. The method of claim 8, wherein the reference portion comprises a dielectric material having a constant PSoR.

10. The method of claim 1, wherein the PSoR changes linearly with wavelength.

11. A processor configured with instructions which, when executed, implement the method of determining at least one characteristic of a target surface as claimed in claim 1.

12. An apparatus for determining at least one characteristic of a target surface, comprising:
- a receiver for receiving a phase map for a first region of a target surface generated using radiation having a first wavelength, and for receiving two further phase maps for the first region each generated using radiation having a respective one of two further wavelengths, each different than the first wavelength; and
- a processor arranged to determine:
- a map of height variations for the first region of the target surface based on the first phase map and the two further phase maps; and
- a relative phase shift on reflection at the target surface responsive to the first phase map and two further phase maps and the map of height variations, wherein the relative phase shift on reflection (PSoR) is indicative of a change in phase resulting from a material composition of the target surface.

13. The apparatus of claim 12, wherein the relative PSoR is determined by:

$$\text{Relative } PSoR(\lambda_n) = \Phi_n - \frac{4\pi d}{\lambda_n}$$

where $\lambda_n$ is one of the first and two further wavelengths and $\Phi$ is a phase change at one of the first and two further wavelengths.

14. The apparatus of claim 12, wherein the processor is arranged to determine $$\Delta\Phi_{12} = \Phi_{\lambda 1} - \Phi_{\lambda 2} = \left(a_1 - \frac{4\pi d}{\lambda_1 \lambda_2}\right)(\lambda_1 - \lambda_2)$$

$$\Delta\Phi_{23} = \Phi_{\lambda 2} - \Phi_{\lambda 3} = \left(a_1 - \frac{4\pi d}{\lambda_2 \lambda_3}\right)(\lambda_2 - \lambda_3)$$

where $\lambda_1, \lambda_2, \lambda_3$ are the first wavelength and two further wavelengths, respectively, and $\Phi_{\lambda 1}, \Phi_{\lambda 2}, \Phi_{\lambda 3}$ are the phase change at the first and two further wavelengths.

* * * * *